United States Patent [19]

Delano

[11] Patent Number: 5,438,288
[45] Date of Patent: Aug. 1, 1995

[54] HIGH DIFFERENTIAL OUTPUT IMPEDANCE SETTER

[75] Inventor: Cary L. Delano, San Jose, Calif.

[73] Assignee: National Semiconductor Corporation, Santa Clara, Calif.

[21] Appl. No.: 285,752

[22] Filed: Aug. 2, 1994

Related U.S. Application Data

[63] Continuation of Ser. No. 70,710, May 28, 1993, abandoned.

[51] Int. Cl.⁶ .............................................. H03F 3/45
[52] U.S. Cl. ..................................... 327/65; 327/307; 330/258
[58] Field of Search ............... 307/521, 494, 491, 246, 307/520; 330/252, 258, 85, 86

[56] References Cited

U.S. PATENT DOCUMENTS

| | | | |
|---|---|---|---|
| 4,125,789 | 11/1978 | Van Schoiack | 307/494 |
| 4,567,384 | 1/1986 | Stuhlmiller | 302/491 |
| 4,833,345 | 5/1989 | Miller | 307/494 |
| 4,839,542 | 6/1989 | Robinson | 307/520 |
| 4,918,399 | 4/1990 | Devecchi et al. | 330/258 |
| 5,093,634 | 3/1992 | Khoury | 330/253 |
| 5,097,489 | 3/1992 | Tucci | 375/120 |

OTHER PUBLICATIONS

IEEE Journal of Solid-State Circuits, Apr. 1991, by Shigetaka Takagi et al. "100-MHz Monolithic Low-Pass Filters with Transmission Zeros Using NIC Integrators".

"Digitally Programmable Continuous Time Linear Phase Lowpass Filter for Hard Disk Drives" Geert A. DeVeirman, Richard G. Yamasak, Silicon Systems, Inc., Tustin, Calif.

IEEE Journal of Solid-State Circuits, vol. 27, No. 2, Feb. 1992, by Bram Nauta "A CMOS Transconductance-C Filter Technique for Very High Frequencies".

Paper 3-B.2, "CMOS Triode Transconductor Continuous Time Filters" by John Pennock, Peter Frith, R. G. Barker, Wilson Microelectronics Ltd. (Reprinted from IEEE CICC, pp. 378-381, 1986).

Paper 3-B.5, "Design Considerations for High-Frequency Continuous-Time Filters and Implementation of an Antialiasing Filter for Digital Video" by Gopinathan, Tsividis, et al. (Reprinted from IEEE J. Solid-State Circuits, vol. SC-25, No. 6, pp. 1368-1378, Dec. '90.

William D. Llewellyn, et al., High-Speed Data Recovery (WAM 1.1: A 33Mb/s Data Synchronizing Phase-Locked-Loop Circuit, presented on Feb. 17, 1988 at the IEEE International Solid-State Circuit Conference.

National Semiconductor Mass Storage Handbook, 1989, pp. 2-29 through 2-63.

Beomsup Kim, High Speed Clock Recovery in VLSI Using Hybrid Analog/Digital Techniques, Memo #UCB/ERL M90/50, Jun. 6, 1990, Elect. Research Lab., UC, Berkeley (particularly p. 81).

Design Review Schematic-Simplified Gain Controlled Amplifier and Exponential AGC Control Combined H_AGC and I_AMP.

Primary Examiner—Timothy P. Callahan
Assistant Examiner—Dinh Le
Attorney, Agent, or Firm—Limbach & Limbach; H. Donald Nelson; Vincenzo D. Pitruzzella

[57] ABSTRACT

A high output impedance setter utilizes a feedback loop to optimally set the gain of a negative impedance converter within a transconductance cell current source to thereby achieve a virtually infinite differential output impedance. The high output impedance setter also utilizes an operational amplifier to offset the inputs of a transconductance cell for a predetermined period commencing upon the application of power to the setter.

4 Claims, 3 Drawing Sheets

# HIGH DIFFERENTIAL OUTPUT IMPEDANCE SETTER

This is a continuation of application Ser. No. 08/970,710 filed on May 28, 1993 and now abandoned.

CROSS-REFERENCE TO RELATED APPLICATIONS

This application is related to U.S. patent application Ser. No. 08/068,559 filed of even date herewith, entitled "LOW VOLTAGE FILTER TRANSCONDUCTANCE CELL" by Cary Loren Delano, assigned to the assignee of the present invention, and said application is incorporated herein by reference.

1. Field of the Invention

The present invention relates to differential current sources and, in particular, a high differential output impedance setter.

2. Description of the Prior Art

Many circuits require the use of current sources with high output impedances. One example of such a circuit is a transconductance capacitor filter where differential output impedances have an adverse effect on the filter's performance characteristics. In order to achieve high differential output impedances, and also provide a high bandwidth, negative impedance converters are used to lower common mode output impedance and to raise or maintain the differential output impedance of transconductors.

Referring to FIG. 1, a prior art circuit 10 for producing a high output impedance is shown. The circuit 10 includes a first transconductor 12, a second transconductor 14 and an amplitude detecting negative impedance converter setter 16. The non-inverting output 18 of the second transconductor 16 is both inputted to the setter 16 and fed back to the inverting input 20 of the first transconductor 12.

The inverting output 22 of the second transconductor 14 is both inputted to the setter 16 and fed back to the non-inverting input 24 of the first transconductor 12. The non-inverting output 26 and the inverting output 28 of the first transconductor 12 are both connected to the non-inverting input 30 and the inverting input 32, respectively, of the second transconductor 14. A control signal 33 is provided by the setter 16 to both a control input 34 of the first transconductor 12 and a control input 36 of the second transconductor 14. A set of capacitances 38, 40 and 42, 44 on the outputs of the first and second transconductors 12 and 14, respectively, comprise both placed capacitances and the parasitic capacitances which result from the layout of the output stage of each of the transconductors 12 and 14. The total amount of this capacitance determines, in part, the oscillation frequency.

In operation, the circuit 10 functions as an oscillator the oscillation amplitude of which is controlled by a negative impedance converter within each of the transconductors 12 and 14. When the transconductors 12 and 14 each have an infinite output impedance, the poles of the oscillator are on the plus and minus portions of the jw axis and, thus, the oscillation amplitude will remain constant.

The current source 10, however, requires a significant number of components, or in the case of integrated circuits, considerable die space, and further requires a significant amount of power for proper operation.

Therefore, it would be desireable to provide a high differential output impedance current source that utilizes fewer components and operates on lower levels of power.

SUMMARY OF THE INVENTION

The preferred embodiment of the present invention is directed to a high output impedance current source that utilizes a feedback loop to optimally set the gain of a negative impedance converter within the current source to thereby achieve a virtually infinite differential output impedance. The circuit of the present invention, because of its configuration, provides a virtually infinite differential output impedance even when operating with a low supply voltage. Thus, a current source circuit in accordance with the present invention uses a differential input transconductance cell having a pair of inverting inputs and two pair of non-inverting inputs. Control means sense a change in the potential across the differential output and in response thereto counteracts the change by adjusting the level of negative impedance generated by the transconductance cell. The circuit of the present invention utilizes only one transconductor, thus reducing the area and power required when implemented as an integrated circuit.

The above features and advantages of the present invention will become apparent from the following description and the appended claims taken in conjunction with the accompanying drawing in which like parts or elements are denoted by like reference numerals.

DETAILED DESCRIPTION OF THE INVENTION

Figure 1:
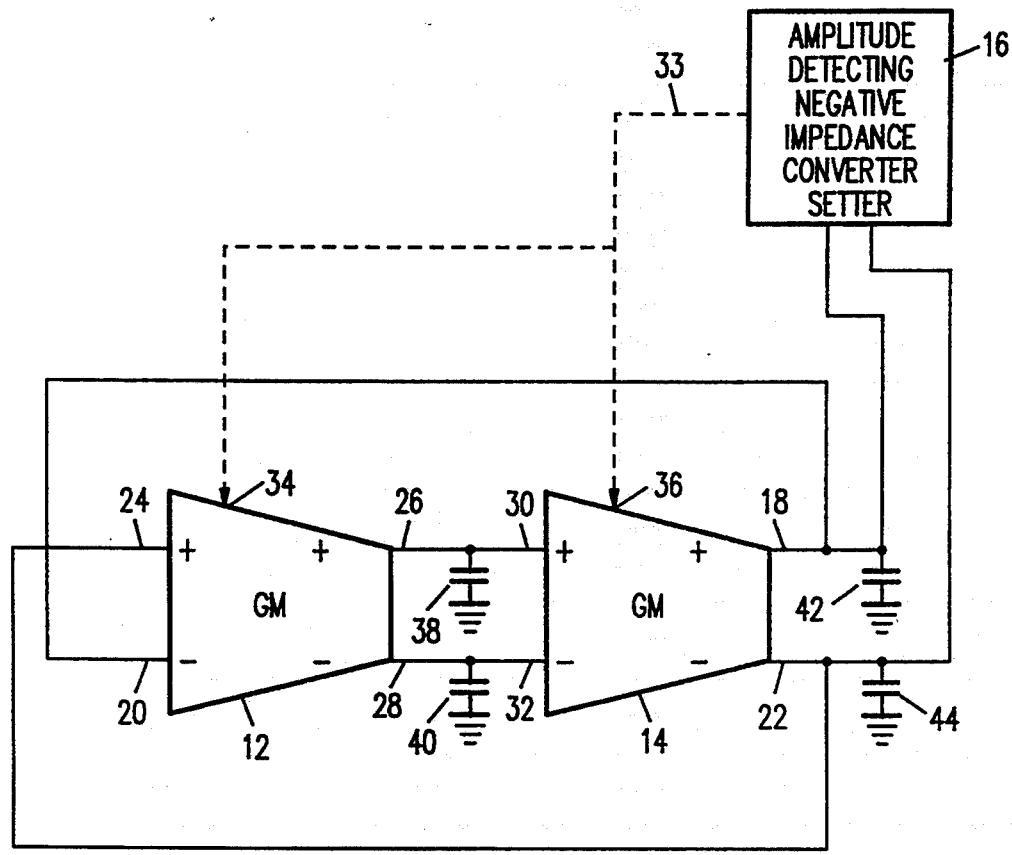
FIG. 1 is a block diagram illustrating a prior art circuit that utilizes feedback to a negative impedance converter to hold constant the oscillation amplitude.
Figure 2:
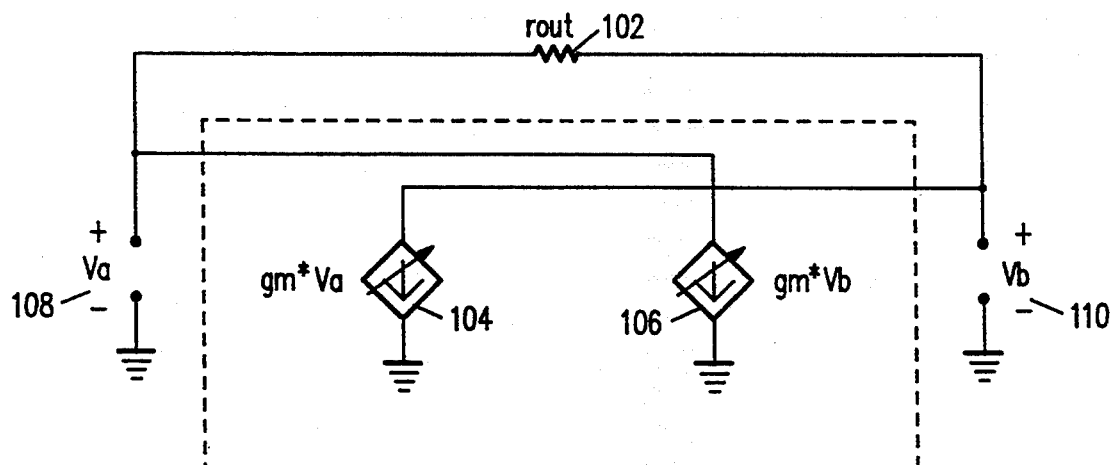
FIG. 2 is a simplified schematic diagram illustrating a negative impedance converter utilizable in accordance with the present invention.

Referring now to FIG. 2, a simplified representation of a negative impedance converter 100 that is incorporated into the present invention is shown. In general, a negative impedance converter achieves a high differential output impedance by placing a positive feedback in parallel with an output impedance 102. The negative impedance converter 100 includes a pair of cross connected transconductance cells 104 and 106 each having a transconductance value of $g_m$. A first input 108 is connected to the junction of the output impedance 102 and the transconductor 106. A second input 110 is connected to the junction of the output impedance 102 and the transconductor 104. For common mode signals, the output impedance is $1/g_m$. The output impedance for differential signals, however, is equal to the parallel combination of the output impedance 102 and $(-1/g_m - 1/g_m)$. The value of this parallel combination may be either positive or negative depending upon the value of $g_m$. If the output impedance is negative and no load is connected to the converter 100, then the converter 100 will latch.

In further detail, the transconductance cell 104 is a voltage controlled current source, having an output current to $(g_m \times V_a)$ amps, where $V_a$ is the voltage across the input 108. Similarly, the transconductance cell 106 is a voltage controlled current source having an output current equal to $(g_m \times V_b)$ amps, where $V_b$ is the voltage across the input 110.

If the magnitude of converter 100, i.e. $(-1/g_m-1/g_m)$, is close to the value of the output impedance 102, then the differential output impedance exhibited at the output impedance 102 will have a magnitude much greater than the output impedance 102. As detailed further herein, using a minimum number of components, the gain of the negative impedance converter 100 is set, by way of a feedback loop, to an optimum value in order to maximize the differential output impedance of a current source.

Figure 3:
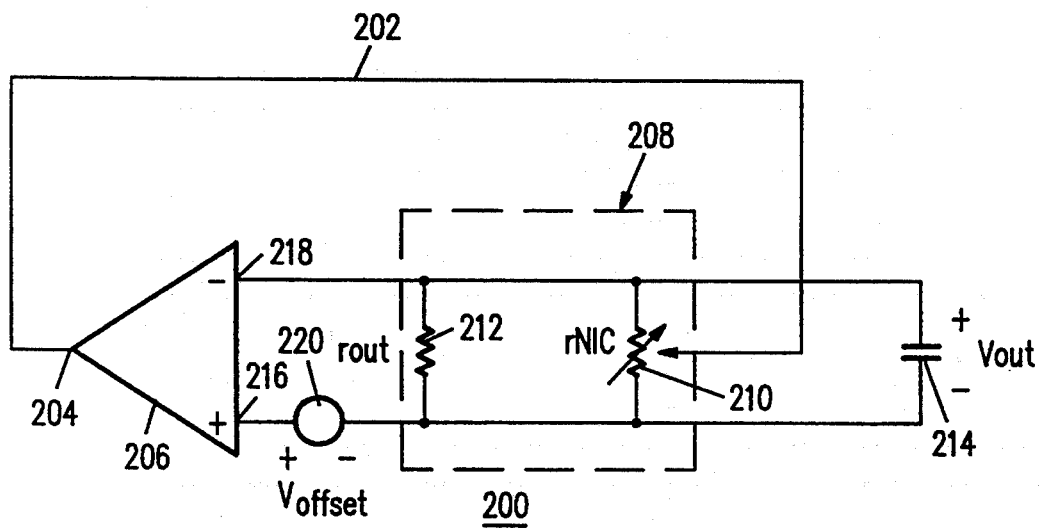
FIG. 3 is a simplified schematic diagram illustrating a high differential output impedance setter in accordance with the present invention.

Referring now to FIG. 3, a simplified embodiment of a high differential output impedance setter 200 in accordance with the present invention is shown. In particular, the setter 200 includes a feedback loop 202 that connects an output 204 of an operational amplifier 206 to the output stage of a transconductance cell 208. In FIG. 3, the output of the transconductance cell 208 is represented by the parallel combination of a variable gain negative impedance converter 210 and an output impedance 212.

The output of the setter 200 operates by utilizing the feedback loop 202 to optimally set the gain of the negative impedance converter 210.

In operation, a d.c. potential ($V_{out}$) is generated by the setter 200 and maintained across a capacitor 214. The capacitor 214 may be a parasitic capacitance or an otherwise desired discrete or active capacitive element. Initially, $V_{out}$ is 0 volts. Thus, the potential across a non-inverting (+) input 216 of the amplifier 206 and the inverting (−) input 218 of the differential amplifier 206 is equal to the potential $V_{offset}$ across an offset generator 220 connected between the output stage of a transconductance cell 208 and the non-inverting input 216 of operational amplifier 206.

Initially, this causes the feedback loop 202 of the operational amplifier 206 to adjust the negative impedance converter 210 such that the net resistance across the capacitor 214 is negative. This allows the capacitor 214 to charge until $V_{out}$ is equal to $V_{offset}$. If $V_{out}$ becomes greater than $V_{offset}$, then the feedback loop 202 of operational amplifier 204 will adjust the negative impedance converter 210 to provide a positive net resistance across the capacitor 214 to thereby discharge the capacitor 214.

When $V_{out}$ becomes equal to $V_{offset}$, the magnitude of the impedance presented by the negative impedance converter 208 will be equal to the value of the output impedance 212. These values cancel each other to thereby generate an infinite differential impedance that maintains the charge on the capacitor 210.

Figure 4:
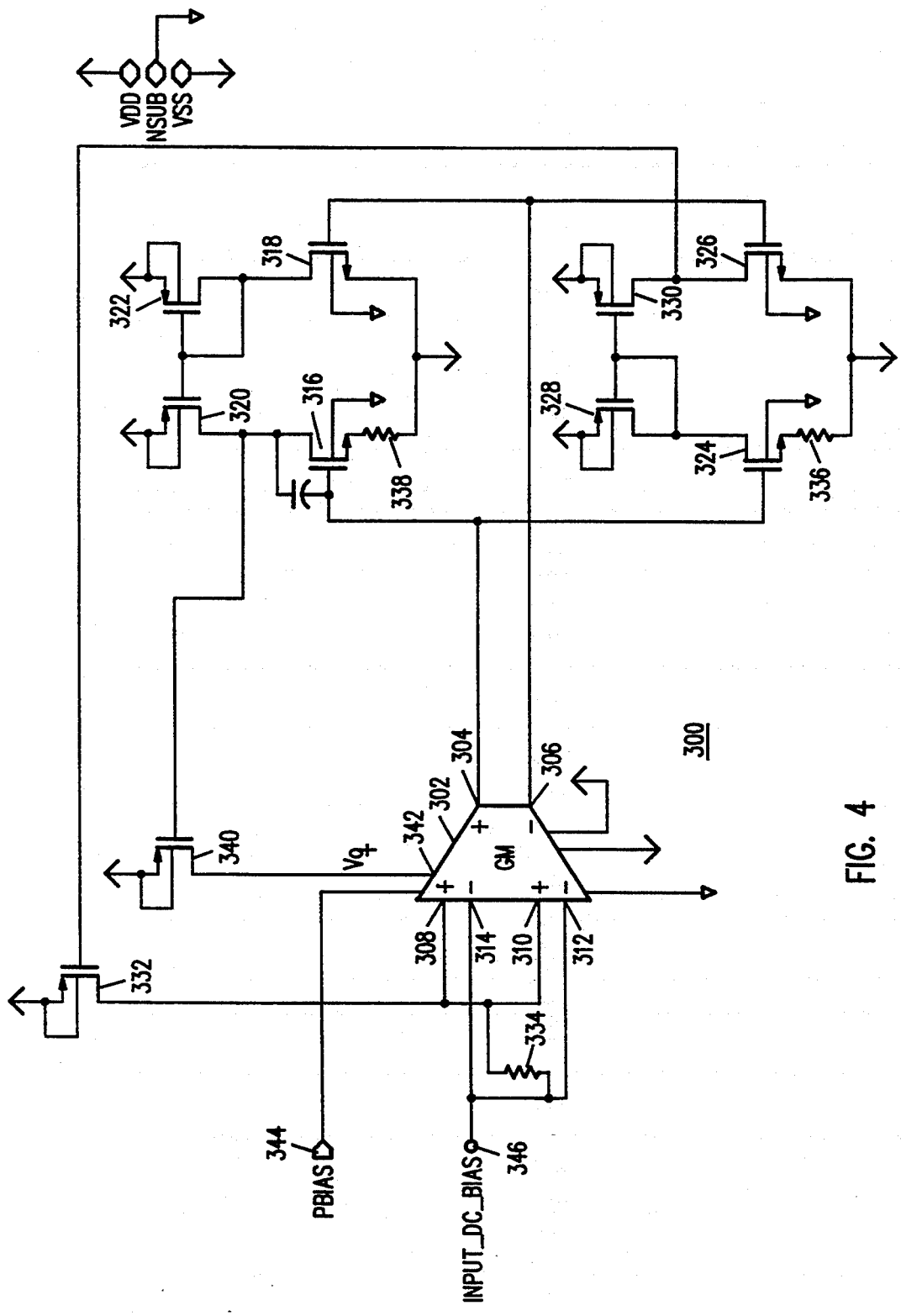
FIG. 4 is a detailed schematic diagram illustrating the high differential output impedance setter in accordance with the present invention.

Referring now to FIG. 4, a detailed schematic diagram of a high differential output impedance setter 300 in accordance with the present invention is shown. The high differential output impedance setter 300 includes a transconductance cell 302 having a +output 304, a −output 306, a first +input 308, a second +input 310, a first −input 312 and a second −input 314. Transconductance cells are well known in the art. However, an embodiment particularly suitable for use in connection with the present invention is disclosed in the cross-referenced U.S. patent application Ser. No. 08/068,559, entitled LOW VOLTAGE FILTER TRANSCONDUCTANCE CELL.

With reference to both FIGS. 3 and 4, the capacitor 214 of FIG. 3 consists of the parasitic capacitances to ground at the outputs 304 and 306 of the transconductance cell 302. Since the transconductance cell 302 is a differential transductor, the node connecting the +output 304, also designated "HIGHER V," acts as the positive terminal of this parasitic capacitance, while the node connecting the −output 306, also designated "LOWER V," acts as the negative terminal of this parasitic capacitance.

An N-channel transistor 316 and an N-channel transistor 318, together with a set of P-channel transistors 320, 322 and 340, function as an operational amplifier having an output that adjusts a negative impedance converter within the transconductance cell 302. Since a net negative output impedance could charge the parasitic capacitances with either polarity, a pair of N-channel transistors 324 and 326, together with a pair of P-channel transistors 328 and 330, function as an operational amplifier the output of which forces the parasitic capacitances to charge in the same direction upon each application of power to the current generator 300. In further detail, transistors 324 and 326 bias the gate of a transistor 332 to thereby cause current to flow through resistor 334 which is connected across the junction of the inputs 308 and 310 and the junction of the inputs 312 and 314. This current through the resistor 334 offsets the inputs 308 and 310 from the inputs 312 and 314 when the parasitic capacitances are first beginning to charge.

A resistor 336 connected between a potential VSS and the source of the transistor 324 operates to offset the operational amplifier consisting of the transistors 324, 326, 328, 330 and 332. An error voltage is produced at the drain of the transistor 326. This error voltage adjusts the gate of the transistor 332 to produce a current through the drain of transistor 332 and, thus, through resistor 334.

Similarly, a resistor 338 connected between the potential VSS and the source of the transistor 316 operates to offset the operational amplifier consisting of transistors 316, 318, 320 and 322. The ratio of the values of the resistors 338 and 336, 2K to 0.5K, guarantees that the operational amplifier consisting of transistors 324, 326, 328 and 330 turns off before the parasitic capacitance has fully charged and, thus, has no effect on the final equilibrium point.

The operational amplifier consisting of transistors 316, 318, 320, 322 operates to adjust the control voltage, $V_q$, of the internal negative impedance converter to thereby maximize the differential output impedance of the transconductance cell 302.

In the preferred embodiment of the invention, transistors 316, 318, 320, 322, 324, 326, 328, 330, 332, and 340 are all insulated gate MOSFET devices. However, other types of transistors may be utilized in practicing the invention.

Since the output impedance of a transconductor may change depending upon its operating points, a pbias input 344 and an input-DC-bias node 346 are provided to adjust the transconductance value of the transconductance cell 302.

While only certain preferred embodiments have been described in detail, as will be apparent to those familiar with the art, certain changes and/or modifications can be made without departing from the scope of the invention as defined by the following claims.

I claim:

1. An output impedance setting circuit for adjusting the output impedance of a differential input transconductance cell, the differential input transconductance cell having at least one positive polarity input, at least one negative polarity input and differential outputs, the circuit comprising:
   control means for sensing a change in the potential across the differential outputs and in response thereto adjusting the level of negative impedance generated within the differential input transconductance cell to counteract said change; and
   offsetting means coupled to the differential outputs and connected to a resistance connected between at least one positive polarity input of the differential amplifier and at least one negative polarity input of the differential amplifier for generating an offset potential between the positive polarity input and the negative polarity input commencing upon initial charging of at least one parasitic capacitance from at least one of the differential outputs to ground and ending prior to the full charging of the parasitic capacitance.

2. The output impedance setting circuit of claim 1, wherein said control means further comprises:
   a MOSFET; and
   an operational amplifier having inputs connected to the differential outputs of the differential input transconductance cell and its output connected to a gate of said MOSFET.

3. An output impedance setting circuit for adjusting the output impedance of a differential input transconductance cell, the differential input transconductance cell having at least one positive polarity input, at least one negative polarity input and differential outputs, the circuit comprising:
   control means for sensing a change in the potential across the differential outputs and in response thereto adjusting the level of negative impedance generated within the differential input transconductance cell to counteract said change; and
   means for offsetting at least one positive polarity input from at least one negative polarity input commencing upon initial charging of at least one parasitic capacitance from at least one of the differential outputs to ground and ending prior to the full charging of the parasitic capacitance, wherein the means for offsetting includes:
   an offset resistor connected across at least one positive polarity input and at least one negative polarity input;
   a MOSFET having a drain, a source and a gate, the source coupled to a voltage supply and the drain coupled to the offset resistor; and
   an operational amplifier having inputs coupled to the differential outputs for generating, commencing upon the initial charging of the parasitic capacitance, a potential at said gate operative to drive current through said offset resistor.

4. An output impedance setting circuit for adjusting the output impedance of a differential input transconductance cell, the differential input transconductance cell having at least one positive polarity input, at least one negative polarity input, a control voltage input and differential outputs, the circuit comprising:
   control means for sensing a change in the potential across the differential outputs and in response thereto adjusting the level of negative impedance generated within the differential input transconductance cell to counteract said change, wherein said control means includes:
   a first MOSFET having a drain, a source and a gate, the source coupled to a voltage supply and the drain coupled to the control voltage input of the differential input transconductance cell; and
   a first operational amplifier having inputs connected to the differential outputs of the differential input transconductance cell and its output connected to the gate of said first MOSFET; and
   means for offsetting at least one positive polarity input from at least one negative polarity input commencing upon initial charging of at least one parasitic capacitance from at least one of the differential outputs to ground and ending prior to the full charging of the parasitic capacitance, wherein the means for offsetting includes:
   an offset resistor connected across at least one positive polarity input and at least one negative polarity input;
   a second MOSFET having a drain, a source and a gate, the source coupled to the voltage supply and the drain coupled to the offset resistor; and
   a second operational amplifier having inputs coupled to the differential outputs of the differential input transconductance cell, for generating, commencing upon the initial charging of the parasitic capacitance, a potential at said gate of the second MOSFET operative to drive current through said offset resistor.

* * * * *